US008430579B2

(12) United States Patent
Tam et al.

(10) Patent No.: US 8,430,579 B2
(45) Date of Patent: Apr. 30, 2013

(54) CAMERA MODULE WITH MOLDED TAPE FLIP CHIP IMAGER MOUNT AND METHOD OF MANUFACTURE

(75) Inventors: Samuel Waising Tam, Daly City, CA (US); Tai Wai (David) Pun, Hong Kong (CN); Tak Shing (Dick) Pang, Hong Kong (CN)

(73) Assignee: Flextronics AP, LLC, Broomfield, CO (US)

( * ) Notice: Subject to any disclaimer, the term of this patent is extended or adjusted under 35 U.S.C. 154(b) by 90 days.

(21) Appl. No.: 12/930,606

(22) Filed: Jan. 11, 2011

(65) Prior Publication Data

US 2011/0194023 A1    Aug. 11, 2011

Related U.S. Application Data

(60) Provisional application No. 61/293,842, filed on Jan. 11, 2010.

(51) Int. Cl.
*G03B 17/00* (2006.01)

(52) U.S. Cl.
USPC .......................................... 396/529; 396/542

(58) Field of Classification Search ............... 396/529, 396/542
See application file for complete search history.

(56) References Cited

U.S. PATENT DOCUMENTS

| 5,866,949 | A | 2/1999 | Schueller |
| 7,233,737 | B2 * | 6/2007 | DeMonte ......................... 396/89 |
| 2001/0030276 | A1 | 10/2001 | Hoshino |
| 2004/0104478 | A1 | 6/2004 | Noguchi |
| 2004/0132491 | A1 | 7/2004 | Kim et al. |
| 2005/0200012 | A1 | 9/2005 | Kinsman |
| 2005/0285973 | A1 * | 12/2005 | Singh et al. ..................... 348/374 |
| 2006/0125925 | A1 | 6/2006 | Lee |
| 2006/0215055 | A1 | 9/2006 | Yoon |
| 2007/0195508 | A1 | 8/2007 | Chen et al. |
| 2008/0079829 | A1 | 4/2008 | Choi et al. |
| 2008/0170141 | A1 | 7/2008 | Tam et al. |
| 2011/0102667 | A1 * | 5/2011 | Chua et al. ..................... 348/374 |

FOREIGN PATENT DOCUMENTS

WO    WO2007/047254    4/2007

OTHER PUBLICATIONS

PCT Application No. PCT/US2011/000044, International Search Report and Written Opinion dated Mar. 15, 2011.

* cited by examiner

*Primary Examiner* — WB Perkey
(74) *Attorney, Agent, or Firm* — Robert G. Crouch; Marsh Fischmann & Breyfogle, LLP

(57) ABSTRACT

A novel design and method for manufacturing camera modules is disclosed. The camera module includes a flexible circuit substrate, an image capture device flip-chip mounted to the bottom surface of the flexible circuit substrate, a housing mounted over the top surface of the flexible circuit substrate, and a lens unit coupled to the housing. In an example embodiment, the camera module includes a stiffener formed directly over a plurality of electrical components mounted on the top surface of the flexible circuit substrate. In another example embodiment, the bottom surface of the flexible circuit substrate defines a recessed portion whereon the image capture device is flip-chip mounted. A disclosed method for manufacturing camera modules includes providing a flexible circuit tape having a plurality of discrete circuit regions, providing a plurality of image capture devices, flip-chip mounting each image capture device on an associate one of the discrete circuit regions, providing a plurality of housings, and mounting each housing on an associate one of the discrete circuit regions.

57 Claims, 14 Drawing Sheets

CAMERA MODULE WITH MOLDED TAPE FLIP CHIP IMAGER MOUNT AND METHOD OF MANUFACTURE

RELATED APPLICATIONS

This application claims the benefit of priority to co-pending U.S. Provisional Patent Application Ser. No. 61/293,842, filed Jan. 11, 2010 by the same inventors and entitled "Camera Module With Molded Tape Flip Chip Imager Mount And Method Of Manufacture," which is incorporated herein by reference in its entirety.

BACKGROUND OF THE INVENTION

1. Field of the Invention

This invention relates generally to electronic camera modules, and more particularly to miniature digital camera modules.

2. Description of the Background Art

Digital camera modules are currently being incorporated into a variety of host devices including, but not limited to, cellular telephones, personal data assistants (PDAs), computers, etc. Therefore, consumer demand for digital camera modules in host devices continues to grow.

Host device manufacturers prefer digital camera modules to be small, so that they can be incorporated into the host device without increasing the overall size of the host device. Not only do host device manufacturers prefer camera modules that are small, but also camera modules that capture images of the highest possible quality. Therefore, it is an ongoing goal for camera module manufacturers to design camera modules that meet these requirements and can be produced at minimal manufacturing cost.

A conventional digital camera module generally includes an integrated image capture device (ICD), a printed circuit board (PCB), a housing, and a lens unit. Typically, the components are formed separately and later assembled to create the digital camera module. That is, the ICD is flip-chip mounted to the bottom of the PCB such that the image capture surface of the ICD is aligned with an optical opening formed through the PCB. Then, the bottom of the housing is attached to the top of the PCB over the optical opening so as to enclose the image capture surface. Once the housing is attached to the PCB, the lens assembly is mounted to the opposite end of the housing so as to focus incident light onto the image capture surface. Typically, the lens unit includes some type of sloped surface (e.g., threads, cam, ramps, etc.) that engage a complementary sloped surface formed on the housing such that proper focusing can be achieved by rotating the lens unit within the housing. After the lens assembly is properly displaced with respect to the image capture surface, the lens assembly is fixed (e.g., via adhesive, thermal weld, etc.) with respect to the housing. The ICD typically includes a set of electrical contacts that are electrically connected to an associate set of contacts of the PCB. The PCB typically includes a second set of electrical contacts that connect to the circuitry of the host device so that the ICD can communicate image data to the host device for processing, display, and storage.

Although the particular types of circuit substrates can vary in different camera module designs, ceramic circuit substrates are often preferred. This is because ceramics provides excellent electrical and thermal insulation while also maintaining structural integrity at high temperatures. Indeed, this is desirable to manufacturers because it provides more freedom to implement electrical bonding techniques (e.g., reflow soldering) that require high temperatures.

Although there are benefits to using ceramic circuit boards in camera modules, there are also several disadvantages. As one example, ceramic circuit substrates are relatively difficult and expensive to manufacture. Typically, ceramic circuit boards are manufactured in large volumes wherein multiple circuit boards are formed simultaneously in a coupon format. This involves first forming an array of discrete circuits on a large ceramic board and then singulating the board into a plurality of individual camera module PCBs. The singulation process typically involves scoring the large ceramic board and then snapping it along the score marks. Because of the inherent brittleness of ceramic material, uncontrolled fracture often results in high yield losses.

As another disadvantage, it is difficult to manufacture ceramic circuit boards with a high degree of geometric accuracy because of the inherent warpage associated with ceramics. That is, raw or "green" ceramic material tends to shrink rather unpredictably during the curing or "firing" process. This is particularly problematic in the large scale production of ceramic circuit boards because a relatively high percentage of ceramic substrates inevitably experience warpage that is too severe for use and, therefore, have to be discarded. As a consequence of the inherent warpage and aforementioned fracturing problems associated with ceramics, manufacturers must implement rigorous quality control processes in order to identify the unusable units. Of course, the strict quality control practices and high yield losses associated with ceramic circuit substrates contribute to both a high overall manufacturing cost and slow manufacturing throughput for the camera modules in which they are employed.

In manufacturing ceramic PCBs, completely eliminating warpage is highly unlikely and the units that do satisfy quality control standards typically exhibit some degree of warpage. Although such warpage may be slight, it is typically sufficient to impose several manufacturing challenges and design constraints. For example, establishing a reliable electrical connection during the flip-chip bonding of an ICD onto a ceramic PCB requires forming a double stud bump on each contact of the ICD. Furthermore, the number of processes and materials that are required for double stud bump bonding can be relatively expensive and time consuming. Therefore, it would be desirable to reduce the number of stud bumps required to achieve a reliable electrical connection between the ICD and the circuit substrate.

As yet another disadvantage, ICDs that are bonded to ceramic circuit substrates typically have to be thicker than those bonded to other types of circuit substrates. Of course, this is undesirable to manufacturers because as the required ICD thickness increases, so does the required overall height of the camera module. One reason that ICDs have to be thicker when mounted on ceramic circuit boards is to withstand the higher bonding forces (i.e., thermocompression force). Another reason such ICDs have to be thick is to withstand high stresses that occur during temperature changes. Such stresses result from a relatively large difference in coefficient of thermal expansion (CTE) between the ceramic of the PCB and silicon of the ICD.

What is needed, therefore, is a camera module design that reduces the number of processes and components required for mounting the ICD on the circuit substrate. What is also needed is a camera module that can be manufactured using a thinner ICD. What is also needed is a camera module design that reduces circuit substrate warpage.

SUMMARY

The present invention overcomes the problems associated with the prior art by providing a simplified camera module design that can withstand high manufacturing temperatures without the need for ceramic. The invention facilitates the mounting of ICDs to camera module circuit substrates using conventional integrated circuit chip bonding techniques.

An example camera module includes a flexible circuit substrate, an image capture device, a housing, and a lens unit. The flexible circuit substrate includes a bottom surface having a plurality of electrical contacts formed thereon, a top surface, and an opening. The image capture device includes a top surface having an image capture surface and a first set of electrical contacts formed thereon and an opposite bottom surface. The top surface of the image capture device is coupled to the bottom surface of the flexible circuit substrate such that the image sensor surface is aligned with the opening and the first set of electrical contacts formed on the top surface of the image capture device are electrically connected to the first set of electrical contacts formed on the bottom surface of the flexible circuit substrate. The housing is mounted over the top surface of the flexible circuit substrate and the lens unit is coupled to the housing such that the lens unit is aligned with both the opening of the flexible circuit substrate and the image capture surface of the image capture device.

In a particular embodiment, the top surface of the flexible circuit substrate includes a first set of electrical contacts formed thereon. The camera module further includes at least one electrical device that is mounted on the top surface of the flexible circuit substrate and is electrically connected to the first set of electrical contacts formed on the top surface of the flexible circuit substrate. In one example embodiment, the at least one electrical device is reflow soldered to the first set of electrical contacts formed on the top surface of the flexible circuit substrate.

In a more particular embodiment, the camera module further includes a first stiffener formed on the top surface of the flexible circuit substrate. More particular embodiments include forming the first stiffener directly over the at least one electrical device. In an even more particular embodiment, the first stiffener is composed of a moldable material that is molded directly over the at least one electrical device. In yet an even more particular embodiment, the stiffener is formed by transfer molding the moldable material. The first stiffener is formed, for example, into the shape of a wall that defines an enclosed perimeter around the opening formed through the flexible circuit substrate.

In the example embodiments, the camera module further includes an infrared filter disposed between the lens unit and the image capture surface of the image capture device. According to one embodiment, the infrared filter is mounted on the top surface of the flexible circuit substrate, within the perimeter enclosed by the first stiffener. In another embodiment, the infrared filter is mounted directly on the image capture surface of the image capture device. In yet another embodiment, the infrared filter is mounted directly to the first stiffener. In a more particular embodiment, the first stiffener defines a recess adapted to seat the infrared filter. Optionally, the infrared filter could be an integral part of the lens unit.

In another particular embodiment, the bottom surface of the flexible circuit substrate includes a recessed portion whereon the first set of electrical contacts of the bottom surface of the flexible circuit substrate are formed. The image capture device is flip-chip mounted to the recessed portion of the bottom surface of the flexible circuit substrate. In a more particular embodiment, the recessed portion of the flexible circuit substrate defines a recess that is adapted to receive the image capture device. Furthermore, the depth of the recess defined by the recessed portion is greater than the thickness of the image capture device.

In another particular embodiment, the bottom surface of the first flexible circuit substrate includes a second set of electrical contacts. In a more particular embodiment, the camera module further includes a second flexible circuit substrate and a second stiffener. The second flexible circuit substrate includes a top surface and a bottom surface. The top surface of the second flexible circuit substrate includes a first set of electrical contacts electrically connected to the second set of electrical contacts formed on the bottom surface of the first circuit substrate. The second stiffener is mounted to the bottom surface of the second flexible circuit substrate.

In a particular embodiment, the housing includes an electronic focus feature operative to adjust the position of the lens unit with respect to said image capture device. In a more particular embodiment, the electronic focus feature includes a voice coil motor. Optionally, the camera module includes a fixed focus feature wherein the lens unit is permanently mounted in a fixed position with respect to the image capture device.

In one embodiment, the first set of electrical contacts formed on the top surface of the image capture device are electrically connected to the first set of electrical contacts formed on the bottom surface of the flexible circuit substrate via conductive bumps. In a more particular embodiment, at least one of the first set of electrical contacts formed on the top surface of the image capture device is electrically connected to an associate one of the first set of electrical contacts formed on the bottom surface of the flexible circuit substrate via a single conductive bump. In an even more particular embodiment, the conductive bumps are stud bumps. In yet a more particular embodiment, the stud bumps are gold stud bumps. In another particular embodiment, the conductive bumps are sputter plated bumps. In another particular embodiment, a non-conductive paste is disposed between the top surface of the image capture device and the bottom surface of the flexible circuit substrate. In another particular embodiment, anisotropic conductive film is disposed between the top surface of the image capture device and the bottom surface of the flexible circuit substrate. In another particular embodiment, anisotropic conductive paste is disposed between the top surface of the image capture device and the bottom surface of the flexible circuit substrate.

Methods for manufacturing a camera module are also disclosed. An example method includes providing a flexible circuit substrate, providing an image capture device, providing a housing, providing a lens unit, mounting the image capture device on the flexible circuit substrate, mounting the housing over the top surface of the flexible circuit substrate, and coupling the lens unit with the housing. The step of providing a flexible circuit substrate includes providing a flexible circuit substrate having a bottom surface that includes a plurality of electrical contacts formed thereon, a top surface, and an opening. The step of providing an image capture device includes providing an image capture device having a top surface that includes an image capture surface and a first set of electrical contacts formed thereon and an opposite bottom surface. The step of mounting the image capture device on the flexible circuit substrate includes coupling the top surface of the image capture device to the bottom surface of the flexible circuit substrate such that the image sensor surface is aligned with the opening and electrically connecting the first set of electrical contacts formed on the top surface of the image capture device to the first set of electrical contacts formed on the bottom surface of the flexible circuit substrate. The step of mounting the housing over the top surface of the flexible circuit substrate includes mounting the housing over the top surface of the flexible circuit substrate such that the housing is aligned with the opening formed through the flexible circuit substrate. The step of coupling the lens unit with the housing includes coupling the lens unit with the housing such that the lens unit is aligned with the opening of the flexible circuit substrate.

The disclosed method further includes providing at least one electrical device, mounting the at least one electrical device on the top surface of the flexible circuit substrate, and electrically connecting the at least one electrical device to the flexible circuit substrate. The step of providing at least one electrical device includes providing at least one electrical device that includes a set of electrical contacts. The step of providing a flexible circuit substrate includes providing a flexible circuit substrate having a top surface whereon a set of electrical contacts are formed. The step of electrically connecting the at least one electrical device to the flexible circuit substrate includes reflow soldering the set of electrical contacts of the at least one electrical component to the set of electrical contacts formed on the top surface of the flexible printed circuit substrate.

The method further includes forming a first stiffener over the at least one electrical component on the top surface of the flexible circuit substrate. The step of forming the first stiffener over the at least one electrical device includes providing a moldable material and molding the moldable material directly over the at least one electrical device and directly on the top surface of the flexible circuit substrate. The step of molding the moldable material includes transfer molding the moldable material.

The step of providing a flexible circuit substrate includes providing a flexible circuit substrate having a bottom surface with a recessed portion whereon the first set of electrical contacts of the bottom surface of the flexible circuit substrate are formed. The step of mounting the image capture device to the flexible circuit substrate includes flip-chip mounting the image capture device to the recessed portion. The recessed portion defines a recess adapted to receive the image capture device. Further, the depth of the recess defined by the recessed portion is greater than the thickness of the image capture device.

In the disclosed method, the step of providing a flexible circuit substrate further includes providing a flexible circuit substrate having a bottom surface with a second set of electrical contacts formed thereon. The method further includes providing a second flexible circuit substrate having a top surface with a first set of electrical contacts formed thereon, providing a second stiffener, electrically connecting the second set of electrical contacts of the bottom surface of the first flexible circuit substrate to the first set of electrical contacts of the top surface of the second flexible circuit substrate, and mounting the second stiffener to the bottom surface of the second flexible circuit substrate.

In the disclosed method, the step of mounting the image capture device on the flexible circuit substrate includes forming a conductive bump on each of the electrical contacts formed on the top surface of the image capture device and electrically bonding each bump to an associate one of the first set of electrical contacts of the bottom surface of the flexible circuit substrate. The step of electrically bonding each bump includes simultaneously bonding each bump via gang bonding. In the disclosed method, the conductive bumps are stud bumps. In a more specific disclosed method, the stud bumps are gold stud bumps. Optionally, the conductive bumps can be sputter plated bumps.

In a disclosed method, the step of mounting the image capture device to the flexible circuit substrate includes providing non-conductive paste and disposing the non-conductive paste between the top surface of the image capture device and the bottom surface of the flexible circuit substrate. In another disclosed method, the step of mounting the image capture device to the flexible circuit substrate includes providing anisotropic conductive film and disposing the anisotropic conductive film between the top surface of the image capture device and the bottom surface of the flexible circuit substrate. In another disclosed method, the step of mounting the image capture device to the flexible circuit substrate includes providing anisotropic conductive paste and disposing the anisotropic conductive paste between the top surface of the image capture device and the bottom surface of the flexible circuit substrate.

The disclosed method further comprising providing a second flexible circuit substrate, providing a second image capture device, providing a second housing, providing a second lens unit, mounting the second image capture device on the second flexible circuit substrate, mounting the second housing over the top surface of the second flexible circuit substrate, and coupling the second lens unit with the second housing. The step of providing a second flexible circuit substrate includes providing a second flexible circuit substrate having a bottom surface that includes a plurality of electrical contacts formed thereon, a top surface, and an opening. The step of providing a second image capture device includes providing a second image capture device having a top surface that includes an image capture surface and a first set of electrical contacts formed thereon and an opposite bottom surface. The step of mounting the second image capture device on the second flexible circuit substrate includes coupling the top surface of the second image capture device to the bottom surface of the second flexible circuit substrate such that the image sensor surface is aligned with the opening and electrically connecting the first set of electrical contacts formed on the top surface of the second image capture device to the first set of electrical contacts formed on the bottom surface of the second flexible circuit substrate. The step of mounting the second housing over the top surface of the second flexible circuit substrate includes mounting the second housing over the top surface of the second flexible circuit substrate such that the second housing is aligned with the opening formed through the second flexible circuit substrate. The step of coupling the second lens unit with the second housing includes coupling the second lens unit with the second housing such that the second lens unit is aligned with the opening of the second flexible circuit substrate.

In the disclosed method, the step of providing the first flexible circuit substrate and the step of providing the second flexible circuit substrate includes providing a single circuit substrate having a plurality of discrete circuit regions, the first flexible circuit substrate being a first discrete circuit region of the single circuit substrate and the second flexible circuit substrate being a second discrete circuit region of the single circuit substrate. As disclosed in the method, the single circuit substrate is flexible circuit tape.

The step of mounting the first image capture device on the first flexible circuit substrate includes mounting the first image capture device on a bottom surface of the first discrete circuit region of the single circuit substrate, the step of mounting the second image capture device on the second flexible circuit substrate includes mounting the second image capture device on a bottom surface of the second discrete circuit region of the single circuit substrate, the step of mounting the first housing on the first flexible circuit substrate includes mounting the first housing on a top surface of the first discrete circuit region of the single circuit substrate, and the step of mounting the second housing on the second flexible circuit substrate includes mounting the second housing on a top surface of the second discrete circuit region of the single circuit substrate.

In the disclosed example method, the first housing is mounted on the first discrete circuit region after the first image capture device is mounted on the first discrete circuit region and the second housing is mounted on the second discrete circuit region after the second image capture device is mounted on the second discrete circuit region.

The disclosed example method further comprises providing a first set of electrical components, providing a second set of electrical components, mounting the first set of electrical components on the top surface of the first discrete circuit region, and mounting the second set of electrical components on the top surface of the second discrete circuit region. Further, the first image capture device is mounted on the first discrete circuit region after the first set of electrical components is mounted on the first discrete circuit region and the second image capture device is mounted on the second discrete circuit region after the second set of electrical components is mounted on the second discrete circuit region. The disclosed method further comprising forming a first stiffener over the first set of electrical components and forming a second stiffener over the second set of electrical components, the first stiffener being formed after the first set of electrical components are mounted on the first discrete circuit region and before the first image capture device is mounted on the first discrete circuit region, the second stiffener being formed after the second set of electrical components are mounted on the second discrete circuit region and before the second image capture device is mounted on the second discrete circuit region. The disclosed method further comprising separating the first discrete circuit region from the single circuit substrate after the first housing is mounted on the first discrete circuit region and separating the second discrete circuit region from the single circuit substrate after the second housing is mounted on the second discrete circuit region.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing a design and method for manufacturing camera modules in a strip format on flexible printed circuit tape. In the following description, numerous specific details are set forth (e.g., number of lenses, adhesives, circuit layout, electrical devices, etc.) in order to provide a thorough understanding of the invention. Those skilled in the art will recognize, however, that the invention may be practiced apart from these specific details. In other instances, details of well known electronic assembly practices and equipment have been omitted, so as not to unnecessarily obscure the present invention.

Figure 1:
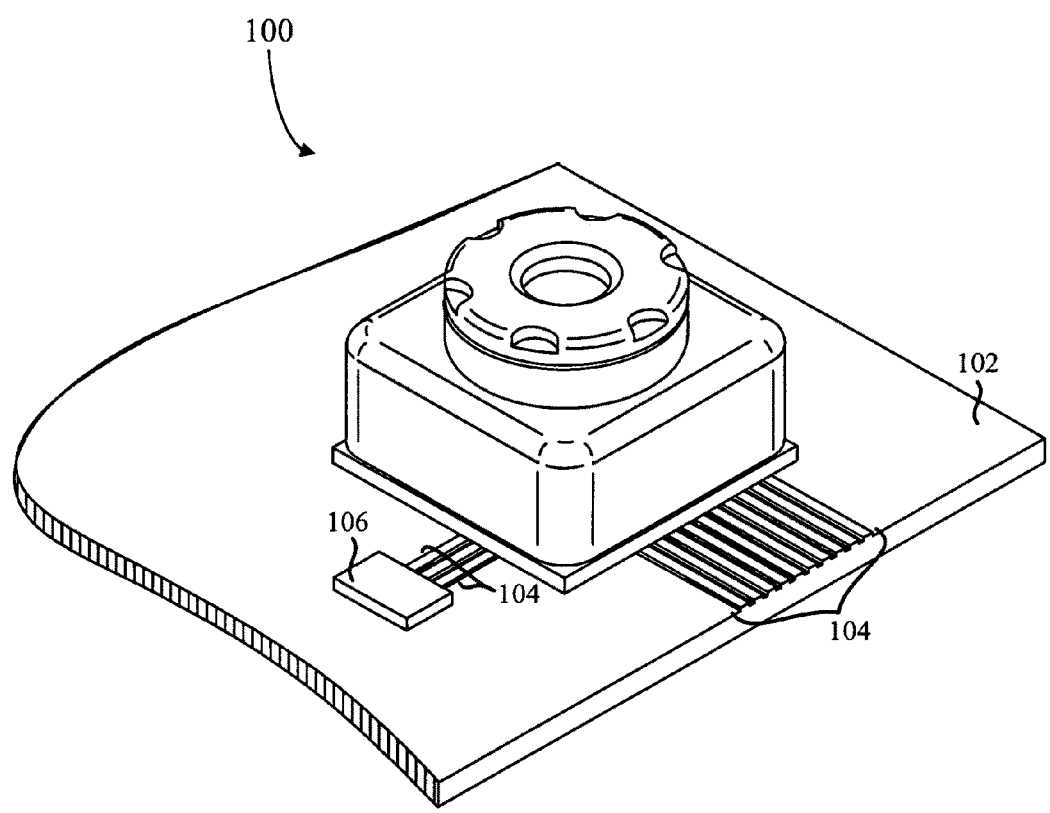
FIG. 1 is a perspective view of a camera module according to one example embodiment of the present invention.

FIG. 1 is a perspective view of a camera module 100 according to one embodiment of the present invention. Camera module 100 is shown mounted on a portion of a printed circuit board (PCB) 102 that represents a PCB of a camera hosting device. Camera module 100 communicates electronically with other components of the hosting device via a plurality of conductive traces 104. Device 106 represents an electronic component (e.g., passive device, etc.) that may be mounted directly on PCB 102. Those skilled in the art will recognize that the particular design of PCB 102 will depend on the particular application, and is not particularly relevant to the present invention. Therefore, PCB 102, traces 104, and device 106 are representational in character only.

Figure 2:
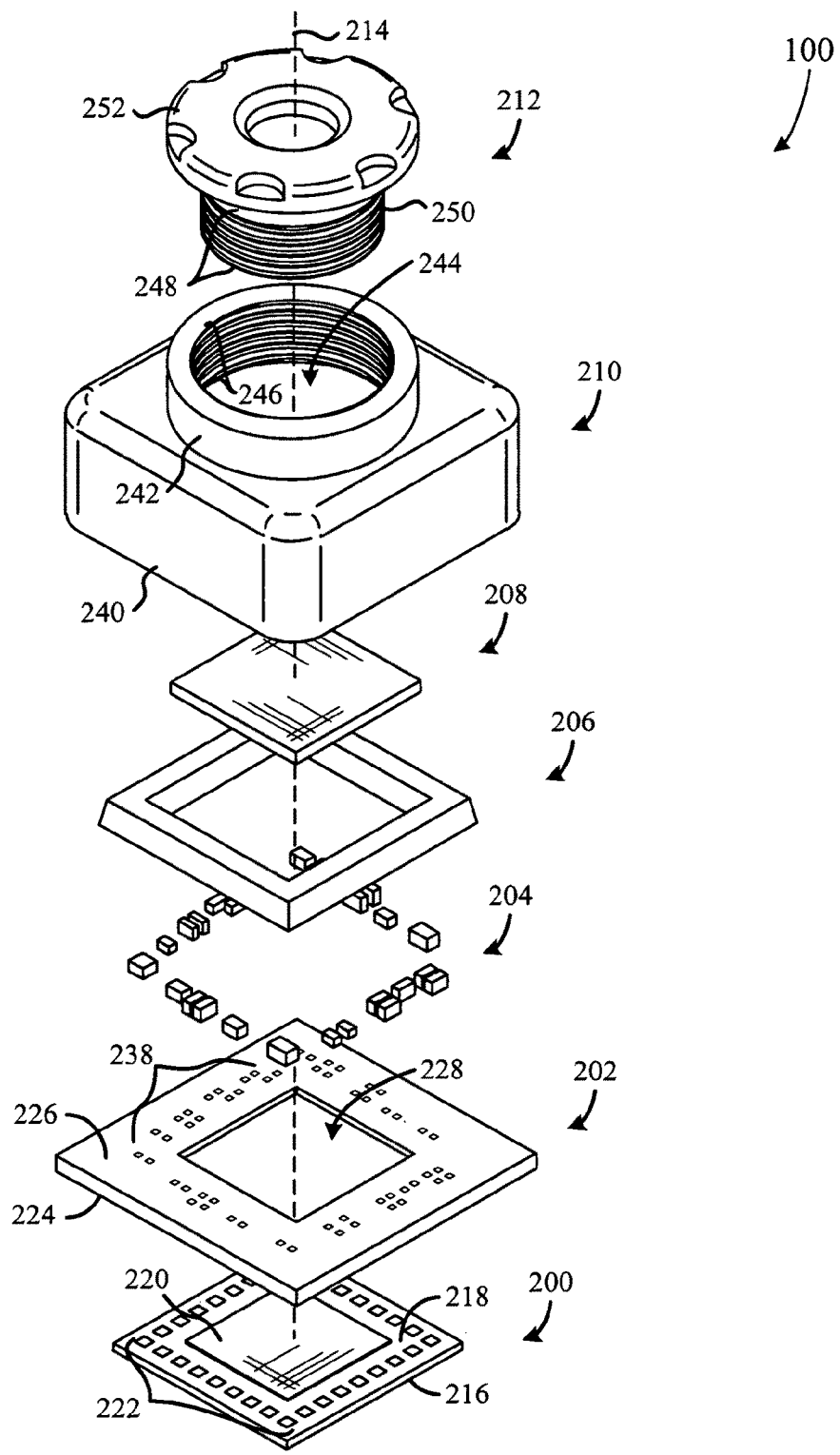
FIG. 2 is a perspective view of the camera module of FIG. 1 exploded along an axis 214.

FIG. 2 shows a perspective view of camera module 100 according to one embodiment of the present invention. In this particular embodiment, camera module 100 includes an image capture device (ICD) 200, a circuit substrate 202, a plurality of electronic components 204, a stiffener 206, an infra-red filter 208, a housing 210, and a lens unit 212 shown exploded along an optical axis 214.

ICD 200 is an integrated circuit (IC) image sensing chip that includes a bottom surface 216 and an opposite top surface 218. Bottom surface 216 is a flat planar surface whereon thermocompression forces are applied during the flip-chip bonding of ICD 200 to circuit substrate 202. Top surface 218 includes an image sensor 220 and a set of electrical contacts 222 formed thereon. Image sensor 220 is, for example, a two-dimensional array of photosensitive elements whereon images are focused and converted into image data. Contacts 222 are conductive pads for electrically connecting ICD 200 to circuit substrate 202. As shown, contacts 222 are arranged on the peripheral region of top surface 218 around image sensor 220 to facilitate the flip-chip mounting of ICD 200 to circuit substrate 202.

Circuit substrate 202 is a flexible printed circuit (FPC) that facilitates electrical communication between ICD 200 and a camera module hosting device. Circuit substrate includes a bottom surface 224 (visible in FIG. 3), a top surface 226, and an opening 228. Note that details of bottom surface 224 will be further described in view of upcoming FIG. 3. Top surface 226 includes a set of electrical contacts 238 for establishing an electrical connection between circuit substrate 202 and electrical components 204. Opening 228 passes through circuit substrate 202 so as to expose image sensor 220 to incident light focused thereon by lens unit 212.

Electrical components 204 represent electronic circuit components such as, for example, resistors, transistors, capacitors, inductors, IC chips, memory devices, processors, and/or any other circuit devices that could be incorporated into a camera module. Although not shown, electrical components 204 include electrical contacts (e.g., contact pads, contact pins, exposed trace, etc.) that electrically connect to respective contacts 238 formed on top surface 226 of circuit substrate 202. In this particular embodiment, electrical components 204 are mounted on top surface 226 of circuit substrate 202 via surface mount technology (SMT) processes and equipment.

Stiffener 206 is a rigid structure that is formed directly over electrical components 204 on top surface 226 of circuit substrate 202 around opening 228. Stiffener 206 is formed after components 204 are mounted and electrically connected to circuit substrate 202 such that electrical components 204 are permanently embedded within stiffener 206.

Infra-red (IR) filter 208 is disposed on top surface 226 of circuit substrate 202 over opening 228.

Housing 210 includes a mounting portion 240 and a receiver portion 242. Mounting portion 240 is adapted to mount on top surface 226 of circuit substrate 202, over electrical components 204 and stiffener 206. Receiver portion 242 includes an opening 244 adapted to receive lens unit 212. Opening 244 defines a set of threads 246 that engage a complementary set of threads 248 formed on lens unit 212 so as to facilitate the focusing of camera module 100. In particular, rotating lens unit 212 in a counter-clockwise direction raises lens unit 212 with respect to housing 210, thereby increasing the distance between lens unit 212 and image sensor 220. Conversely, rotating lens unit 212 in a clockwise direction lowers lens unit 212 with respect to housing 210, thereby decreasing the distance between lens unit 212 and image sensor 220. Thus, an image focused by lens unit 212 can be properly adjusted to lie in the focal plane of image sensor 220. After lens unit 212 is positioned correctly, lens unit 212 is fixed with respect to housing 210 by some suitable means (e.g., adhesive, thermal weld, etc.).

Lens unit 212 further includes a body 250 and a flange 252. Body 250 extends along optical axis 214 and is functional to carry the optical components 254 (shown in FIG. 5) of lens unit 212. Flange 252 provides a surface for a user and/or machine (e.g., automatic focusing machines) to engage during the factory focusing of camera module 100.

Figure 3:
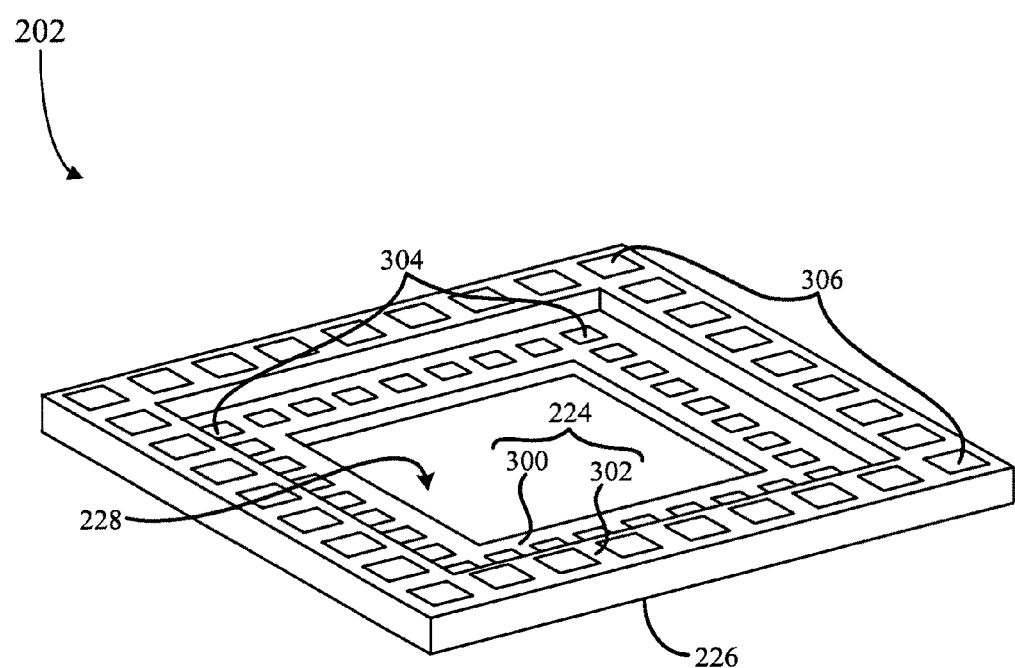
FIG. 3 is a perspective view of a circuit substrate of the camera module of FIG. 1.

FIG. 3 is a perspective view of circuit substrate 202 showing details of bottom surface 224. In this particular embodiment, bottom surface 224 defines a recessed portion 300 and a non recessed portion 302. Recessed portion 300 is adapted to receive ICD 200 and includes a plurality of contacts 304 for electrically connecting the circuitry of circuit substrate 202 to ICD 200. During the flip-chip mounting ICD 200 to circuit substrate 202, each one of contacts 304 of circuit substrate 202 is electrically coupled to an associate one of contacts 222 of circuit substrate 202. As shown, contacts 304 are disposed around opening 228 such that when ICD 200 is flip-chip mounted, image sensor 220 aligns with opening 228. Non-recessed portion 302 includes, a plurality of contacts 306 for electrically connecting circuit substrate 202 to the circuitry of PCB 102 (FIG. 1) by some suitable means (e.g., solder).

Figure 4:
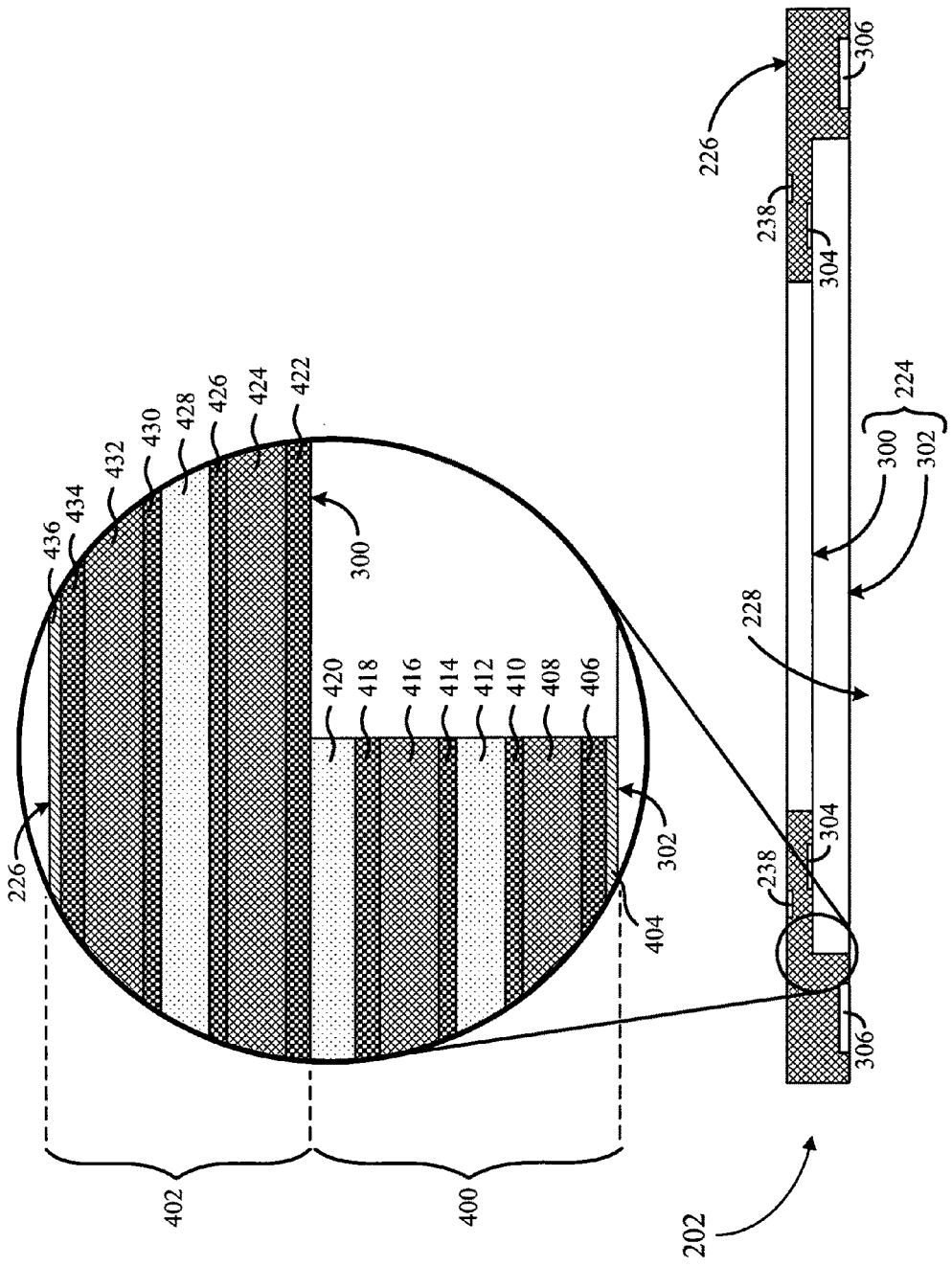
FIG. 4 is a cross sectional view of the circuit substrate of FIG. 3.

FIG. 4 shows a cross-sectional side view of circuit substrate 202 according to one embodiment of the present invention. Circuit substrate 202 is a multilayer flexible printed circuit having a plurality of printed flexible polyimide layers bonded to one another via bonding film. To better illustrate the layers, a sectioned portion of circuit substrate 202 is shown enlarged. It should be understood, however, that the drawing of FIG. 4 is not to scale. Further, it should also be understood that the particular circuit design characteristics (e.g., number of layers, material types, circuit details, etc.) of circuit substrate 202 will depend on the particular application and can, therefore, be altered without departing from the scope of the present invention.

Circuit substrate 202 includes first portion 400 and a second portion 402 that define non-recessed portion 302 and recessed portion 300, respectively. First portion 400 includes a soldermask layer 404, a first copper foil layer 406, a first polyimide layer 408, a second copper foil layer 410, a first bonding film layer 412, a third copper foil layer 414, a second polyimide layer 416, a fourth copper foil layer 418, and a second bonding film layer 420. Layer 404 is formed on layer 406 and defines at least a part of bottom surface 224. First copper foil layer 406 and second copper layer 410 are circuit features (e.g., traces, contacts, etc.) printed on opposite sides of first polyimide layer 408. Likewise, third copper foil layer 414 and fourth copper foil layer 418 are circuit features printed on opposite sides of second polyimide layer 416. Bonding film layer 412 is disposed between copper foil layers 410 and 412 so as to couple polyimide layers 408 and 416 to one another after traces are formed on each. Similarly, first portion 400 and second portion 402 are bonded to one another via second bonding film layer 420. Second portion 402 includes a first copper foil layer 422, a first polyimide layer 424, a second copper foil layer 426, a first bonding film layer 428, a third copper foil layer 430, a second polyimide layer 432, a fourth copper foil layer 434, and a soldermask layer 436. First copper foil layer 422 and second copper foil layer 426 are, for example, circuit traces printed on opposite sides of first polyimide layer 424. Likewise, third copper foil layer 430 and fourth copper foil layer 434 are, for example, circuit features printed on opposite sides of second polyimide layer 432. Bonding film layer 428 is disposed between copper foil layers 426 and 430 so as to couple polyimide layers 424 and 432 to one another after circuit features are formed on each. Layer 436 is formed on layer 434 and defines at least a part of top surface 226.

Figure 5:
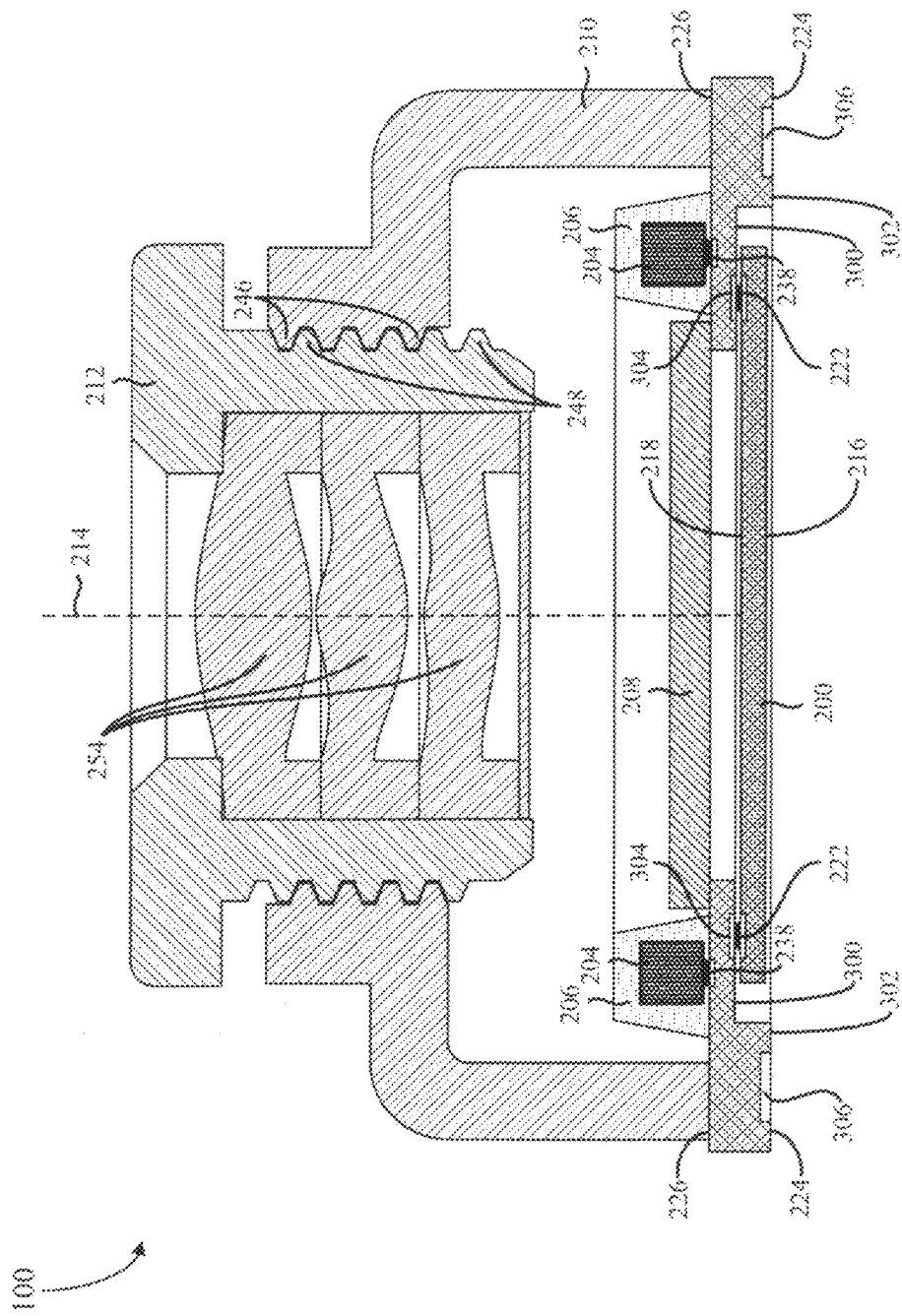
FIG. 5 is a cross sectional view of the camera module of FIG. 1.

FIG. 5 is a cross-sectional view of fully assembled camera module 100. As shown, ICD 200 and electrical components 204 are mounted and electrically connected on opposite sides of circuit substrate 202, stiffener 206 is formed on circuit substrate 202 over electrical components 204, IR filter is mounted on circuit substrate 202 over opening 228, housing 210 is mounted to circuit substrate 202, and lens unit 212 is mounted in opening 244 of housing 210.

ICD 200 is flip-chip mounted to recessed portion 300 of circuit substrate 202 via thermocompression bonding. Further, each of contacts 222 of ICD 200 is electrically connected to an associate one of contacts 304 using only a single gold stud bump 500 for each joint. Although not shown, an underfill of nonconductive material (e.g., nonconductive paste, epoxy, thermoset plastic, etc.) could be deposited in recessed portion 300 so as to reinforce the bond between ICD 200 and circuit substrate 202.

It should be recognized that the distance between recessed portion 300 and non-recessed portion 302 of circuit substrate 202 is greater than the distance between bottom surface 216 and top surface 218 of ICD 200 such that the depth of recessed portion 300 is greater than the thickness of ICD 200. Thus, ICD 200 does not contribute to the overall height of camera module.

Electrical components 204 are electrically coupled to contacts 238 of circuit substrate 202 via SMT. For example, electrical components 204 are positioned on top surface 226 via pick-and-place equipment and then electrically coupled to contacts 238 via reflow soldering.

Stiffener 206 is formed by transfer molding a moldable material directly on top surface 226 of circuit substrate 202 and over electrical components 204. Because electrical components 204 are imbedded in stiffener 206, the overall circuitry of camera module 100 is made very robust. After stiffener 206 is formed, the electrical connections between electrical components 204 and circuit substrate 202 are far less vulnerable to damage during subsequent manufacturing processes. The added rigidity is particularly beneficial during camera module manufacturing processes because when ICD 200 and electrical components 204 are electrically connected to circuit substrate 202, deflection in circuit substrate 202 can result in broken or damaged electrical joints between contacts.

IR filter 208 is mounted on top surface 226, over opening 228 by some suitable means such as, for example, an epoxy. An addition to filtering light, IR filter 208 also prevents particulate debris from entering opening 228 and accumulating on image surface 220.

FIGS. 6a-6g illustrate various stages of a method for manufacturing camera modules 100 according to one embodiment of the present invention.

Figure 6A:
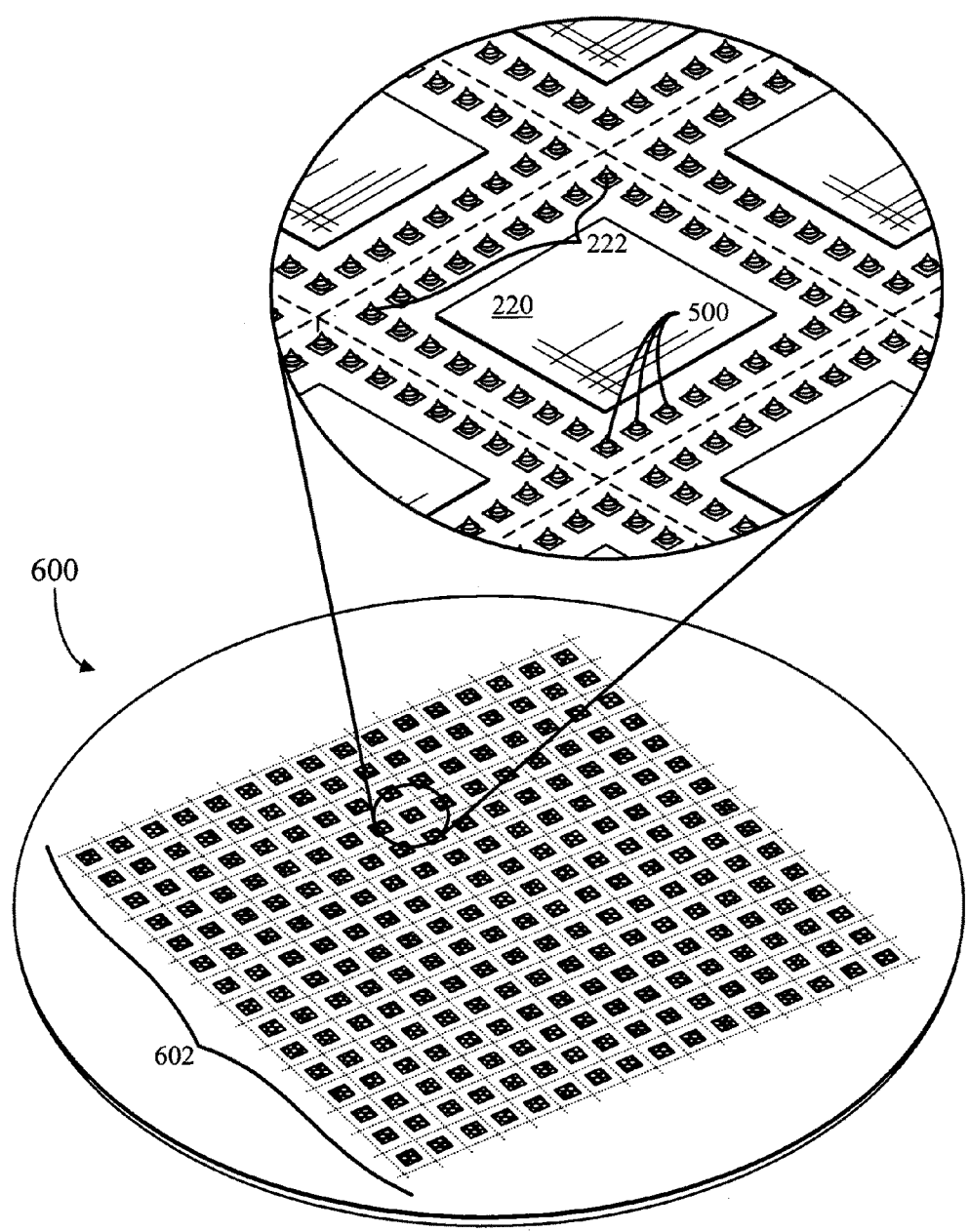
FIG. 6a illustrates a stage of manufacturing the camera module of FIG. 1.

FIG. 6a illustrates the manufacturing and preparation of ICDs 200 on an integrated circuit ICD wafer 600. First, an array of discrete ICD circuits 602 is formed on wafer 600. Each of ICD circuits 602 includes an image sensor 220 and a plurality of electrical contacts 222. Once ICD circuits 602 are formed, wafer 600 undergoes a stud bumping process wherein a single gold stud bump 500 is formed on each contact 222. After the stud bumping process, wafer 600 undergoes a singulation process (e.g., sawing) to separate the individual ICDs 200.

Figure 6B:
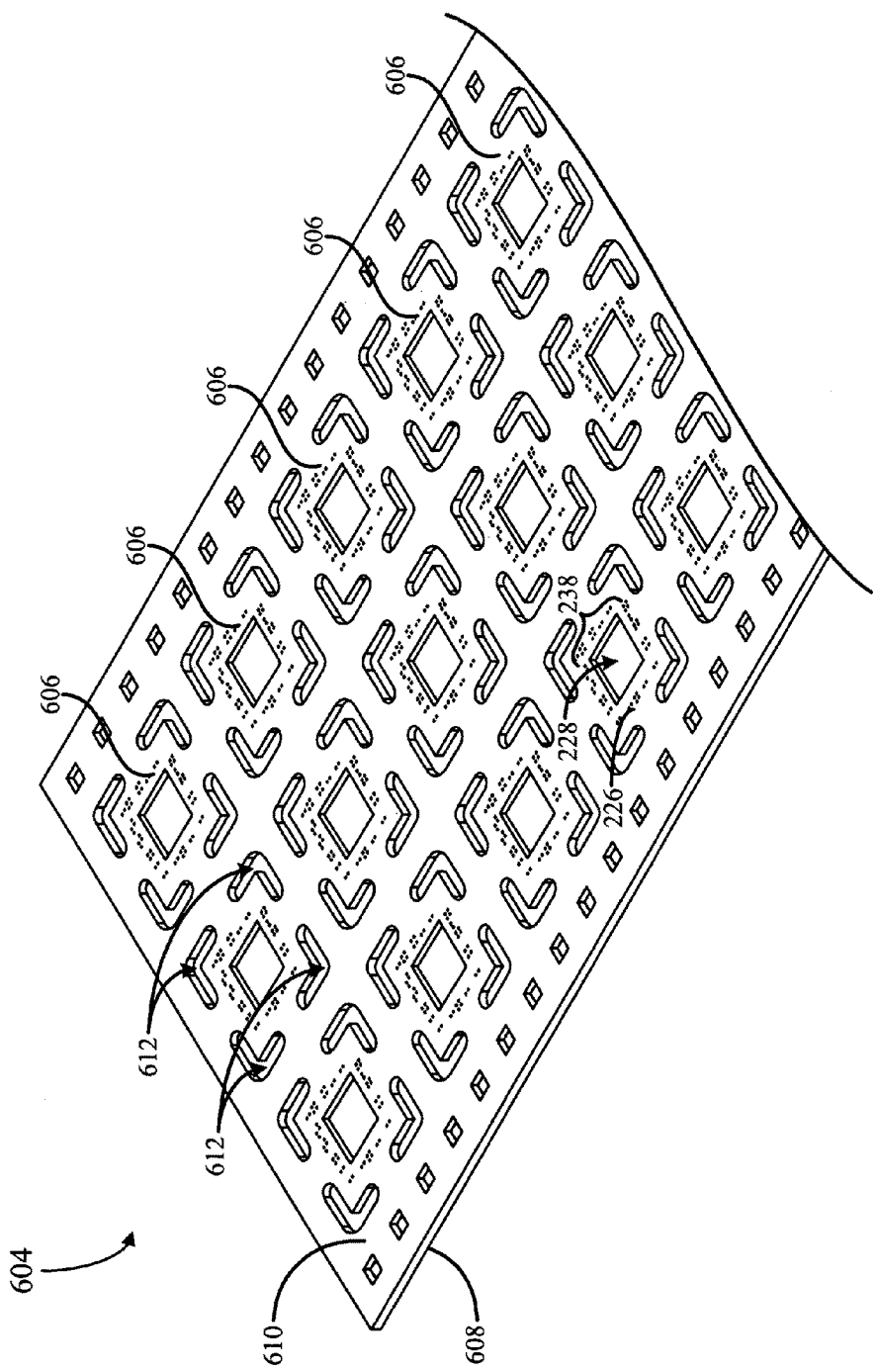
FIG. 6b illustrates another stage of manufacturing the camera module of FIG. 1.

FIG. 6b illustrates a stage of providing a strip of flexible printed circuit tape 604 that includes a plurality of discrete circuit regions 606, a bottom surface 608 (not visible), a top surface 610, and a plurality of L-shaped holes 612. In this example, there is a total of fifteen visible circuit regions 606 of tape 604. It should be recognized that discrete circuit regions 606 are circuit substrates 202 that have not yet been removed from tape 604. Accordingly, the features of discrete circuit regions 606 are identical to those of circuit substrates 202 and are, therefore, referenced herein using the same characters. That is, each discrete circuit region 606 includes a bottom surface 224 having both a recessed portion 300 and a non-recessed portion 302 with contacts 304 and 306, respectively, formed thereon. Furthermore, each discrete circuit region 606 also includes a top surface 226 with contacts 238 formed thereon and an opening 228 passing therethrough. Indeed, bottom surface 224 and top surface 226 of ICD 200 are integral parts of bottom surface 608 and top surface 610, respectively, of tape 604. L-shaped holes 612 facilitate the removal of circuit regions 606 so as to yield circuit substrates 202. As shown, the four corners of each circuit region 606 are defined by a respective set of four L-shaped holes 612.

Figure 6C:
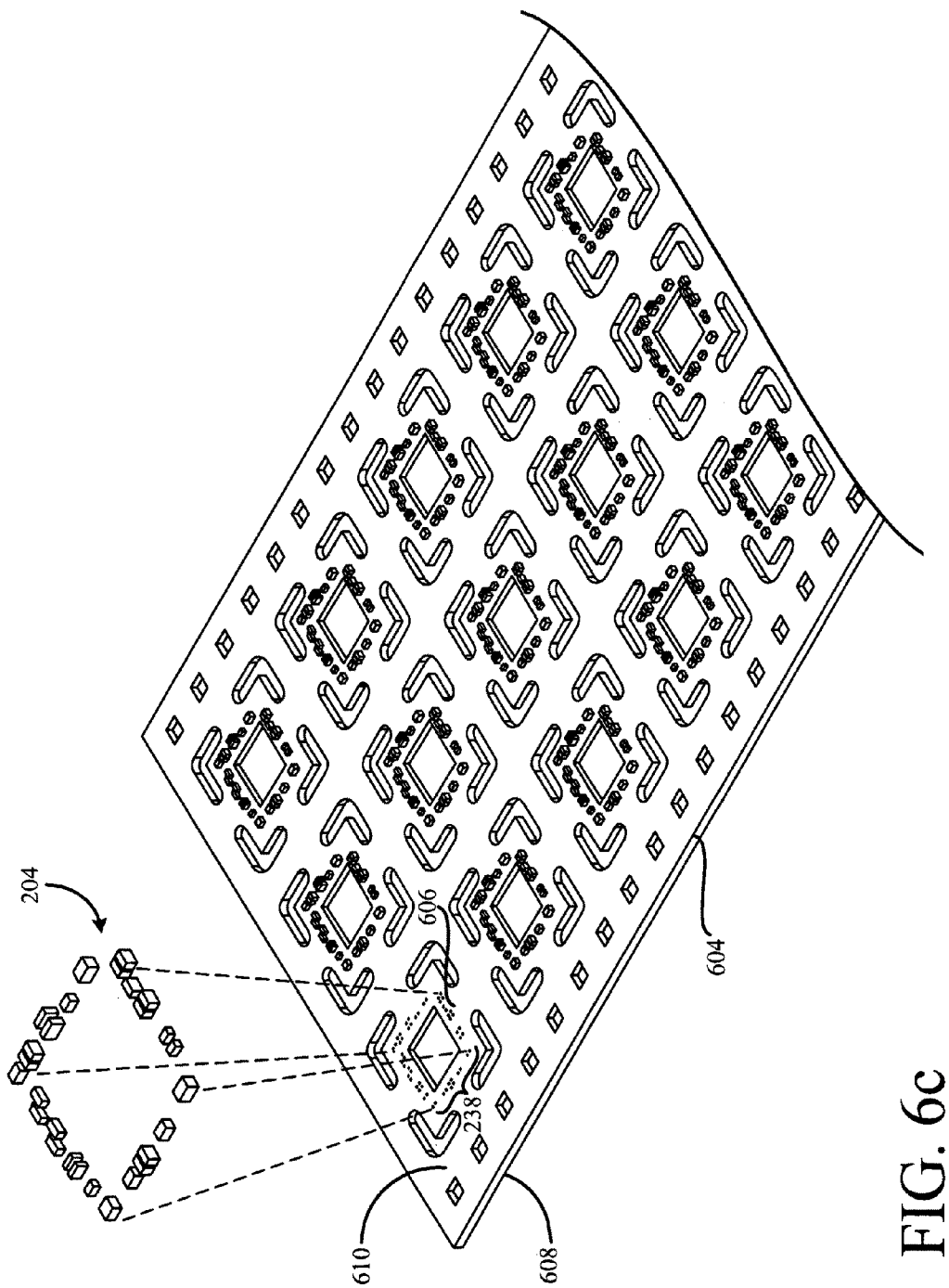
FIG. 6c illustrates another stage of manufacturing the camera module of FIG. 1.

FIG. 6c illustrates a stage of SMT mounting electrical components 204 on top surface 610 of tape 604. First, top surface 610 of tape 604 is screen printed so as to form a pattern of solder paste on top surface 226 of each respective circuit regions 606. Then, a set of electrical components 204 is accurately positioned on each respective solder paste pattern via pick-and-place equipment. After electrical components 204 have been positioned on each respective solder paste pattern, the solder paste is reflowed so as to form electrically connect the contacts of electrical components 204 to respective contacts 238. The reflow process involves supplying a controlled heat using reflow equipment such as, for example, a reflow oven, infrared lamp, heat gun etc.

Figure 6D:
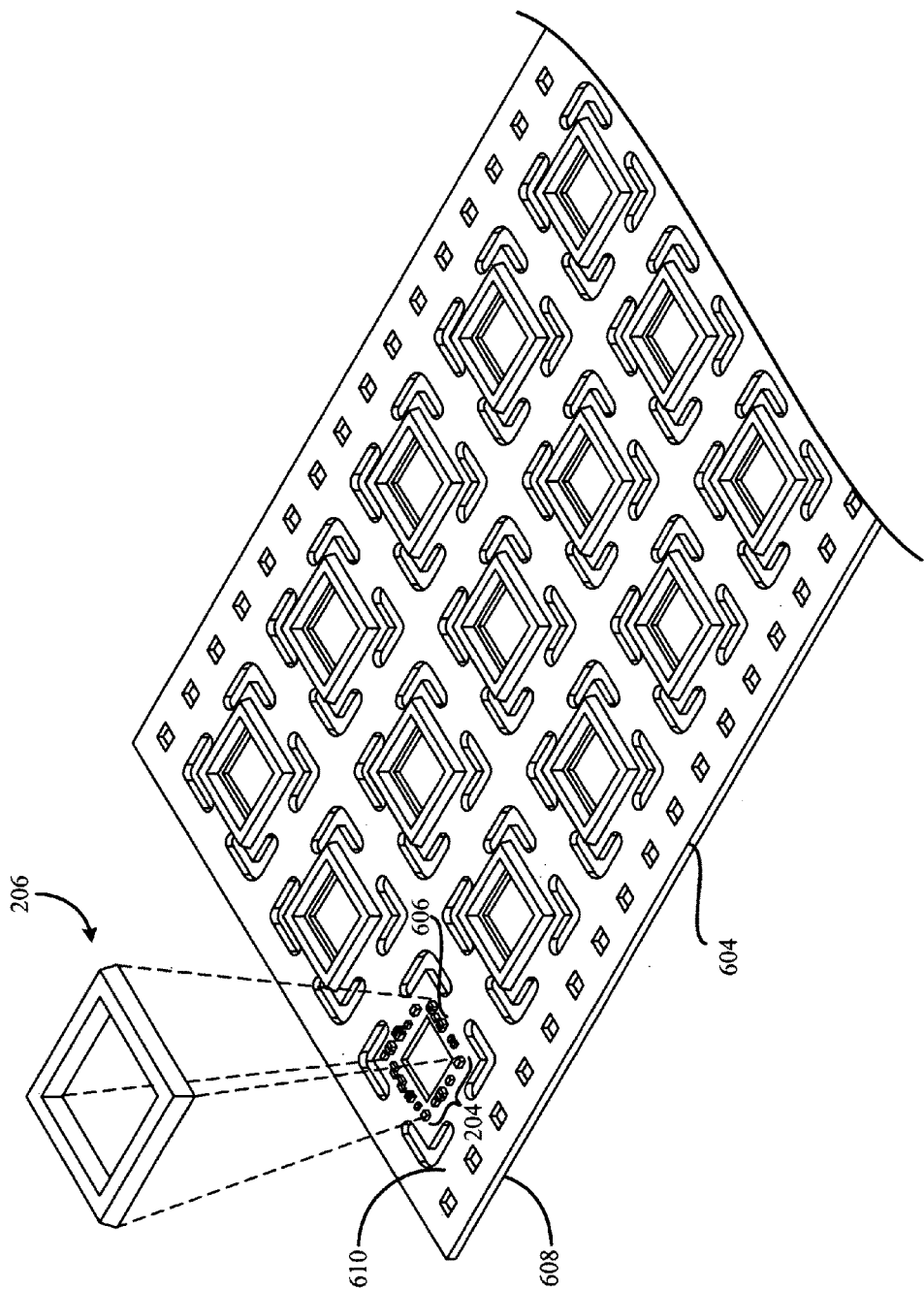
FIG. 6d illustrates another stage of manufacturing the camera module of FIG. 1.

FIG. 6d illustrates a stage of forming a plurality of stiffeners 206 on top surface 610 of tape 604. With electrical components 204 already reflow soldered, an individual stiffener 206 is formed over each respective set of electrical components 204 via transfer molding.

Figure 6E:
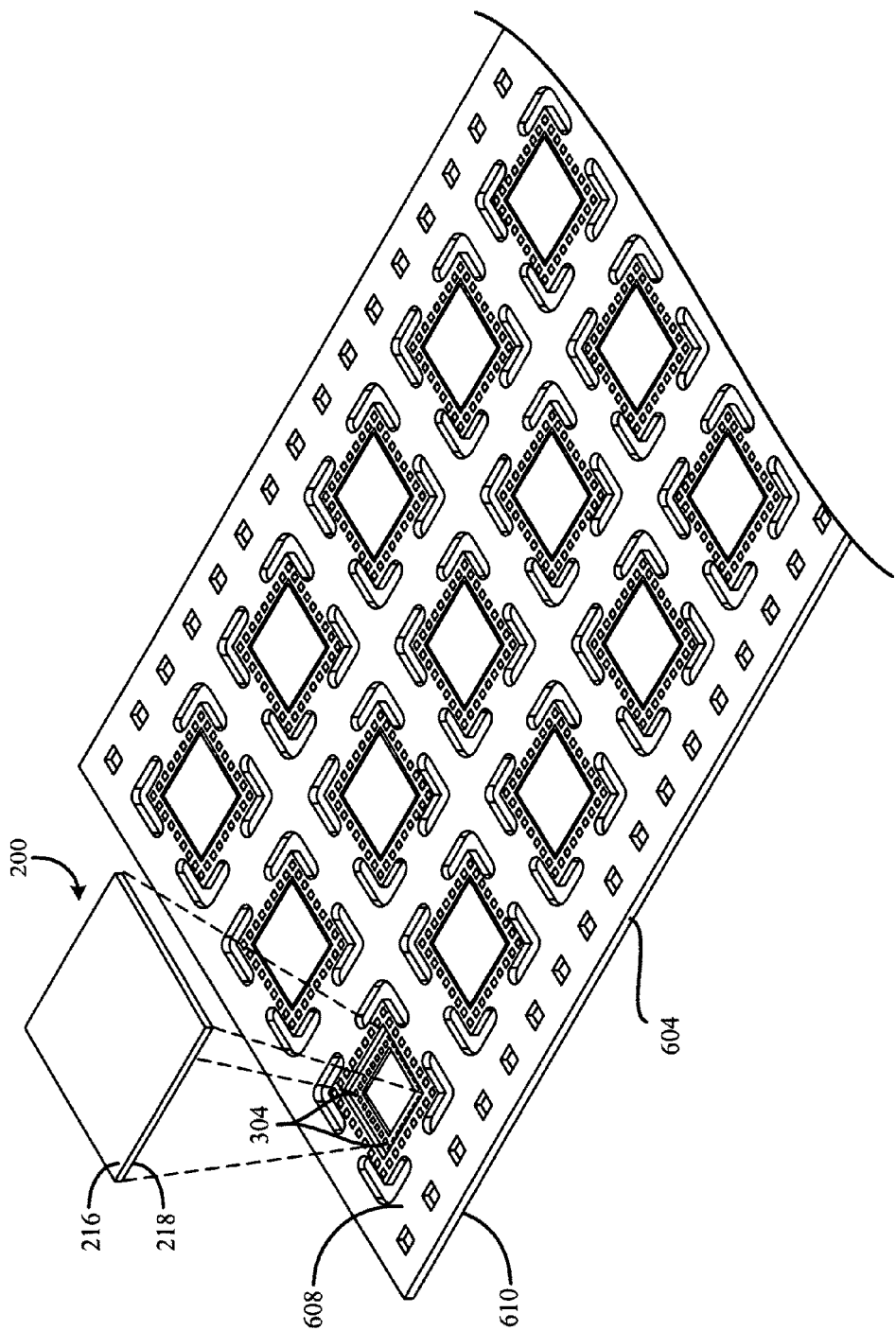
FIG. 6e illustrates another stage of manufacturing the camera module of FIG. 1.

FIG. 6e illustrates a stage of flip-chip mounting a plurality of ICDs 200 to bottom surface 608 of tape 604. After stiffeners 206 are formed on top surface 610 of tape 604, non-conductive paste (NCP) is applied to each of recessed portion 300 of bottom surface 608 of tape 604. Then, a gold stud bumped ICD 200 is positioned on each recessed portion 300 such that each gold stud bump 500 is aligned with a respective contact 304. Next, ICDs 200 are gang bonded by applying thermocompression to bottom surfaces 216.

Figure 6F:
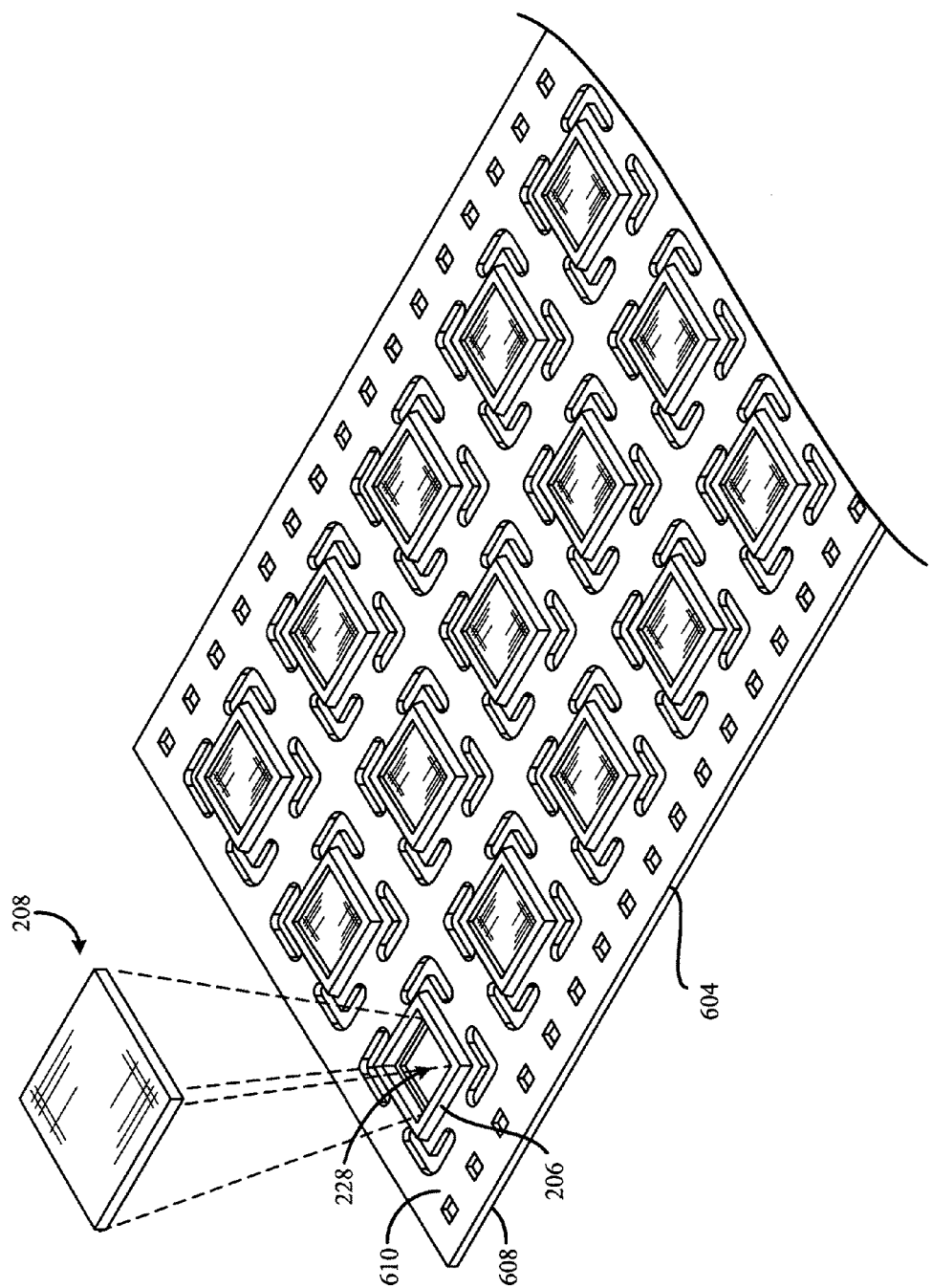
FIG. 6f illustrates another stage of manufacturing the camera module of FIG. 1.

FIG. 6f illustrates a stage of mounting a plurality of IR filters 208 on top surface 610 of tape 604. After ICDs 200 are mounted on bottom surface 608 of tape 604, an IR filter 208 is attached to the top surface 226 of each discrete circuit regions 606 by some suitable means such as, for example, an adhesive.

Figure 6G:
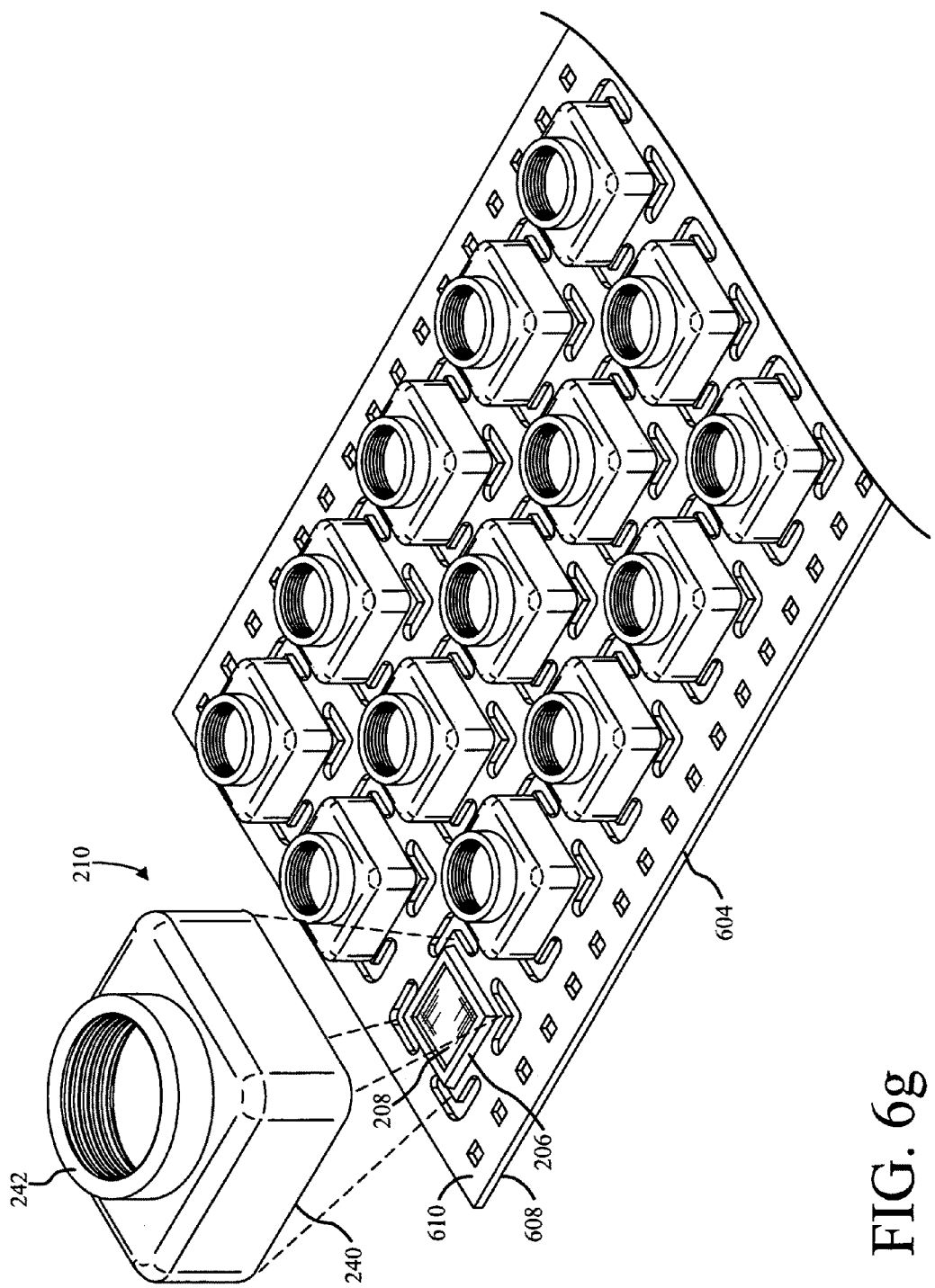
FIG. 6g illustrates another stage of manufacturing the camera module of FIG. 1.

FIG. 6g illustrates a stage of mounting a plurality of housings 210 on top surface 610 of tape 604. After IR filters 208 are mounted on top surface 610 of tape 604, a housing 210 attached to each top surface 226 of discrete circuit regions 606 by some suitable means such as, for example, an adhesive.

Figure 6H:
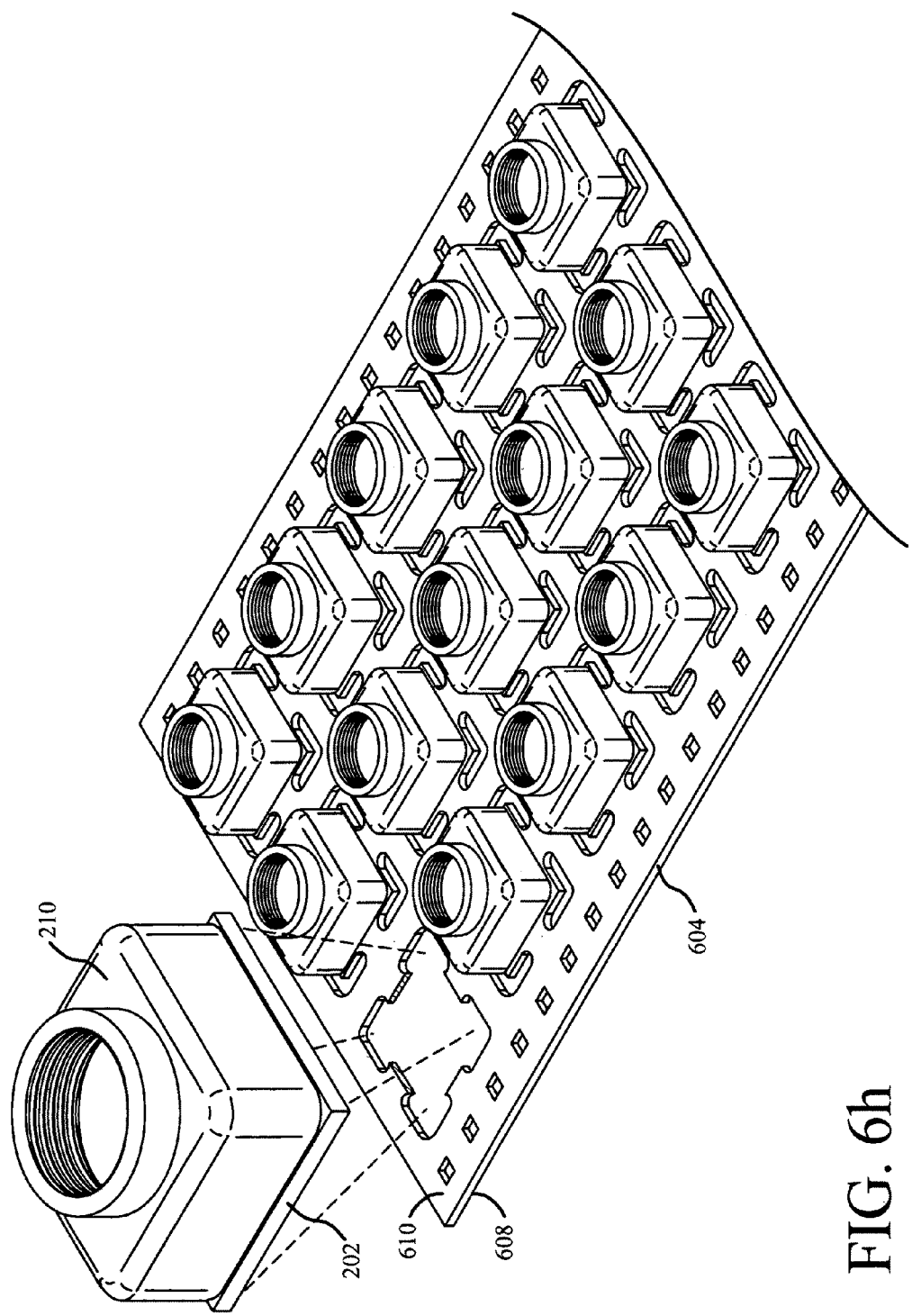
FIG. 6h illustrates another stage of manufacturing the camera module of FIG. 1.

FIG. 6h illustrates a stage of disconnecting discrete circuit regions 606 from tape 604. After housings 210 are mounted on top surfaces 226 of discrete circuit regions 606, each discrete circuit region 606 is disconnected from tape 604 via known tape punching processes. Then, lens units 212 are coupled to each respective one of housings 210 so as to yield a plurality of camera modules 100. Alternatively, lens units 212 could be coupled to housings 210 before disconnecting discrete circuit regions 606 from tape 604.

Figure 7:
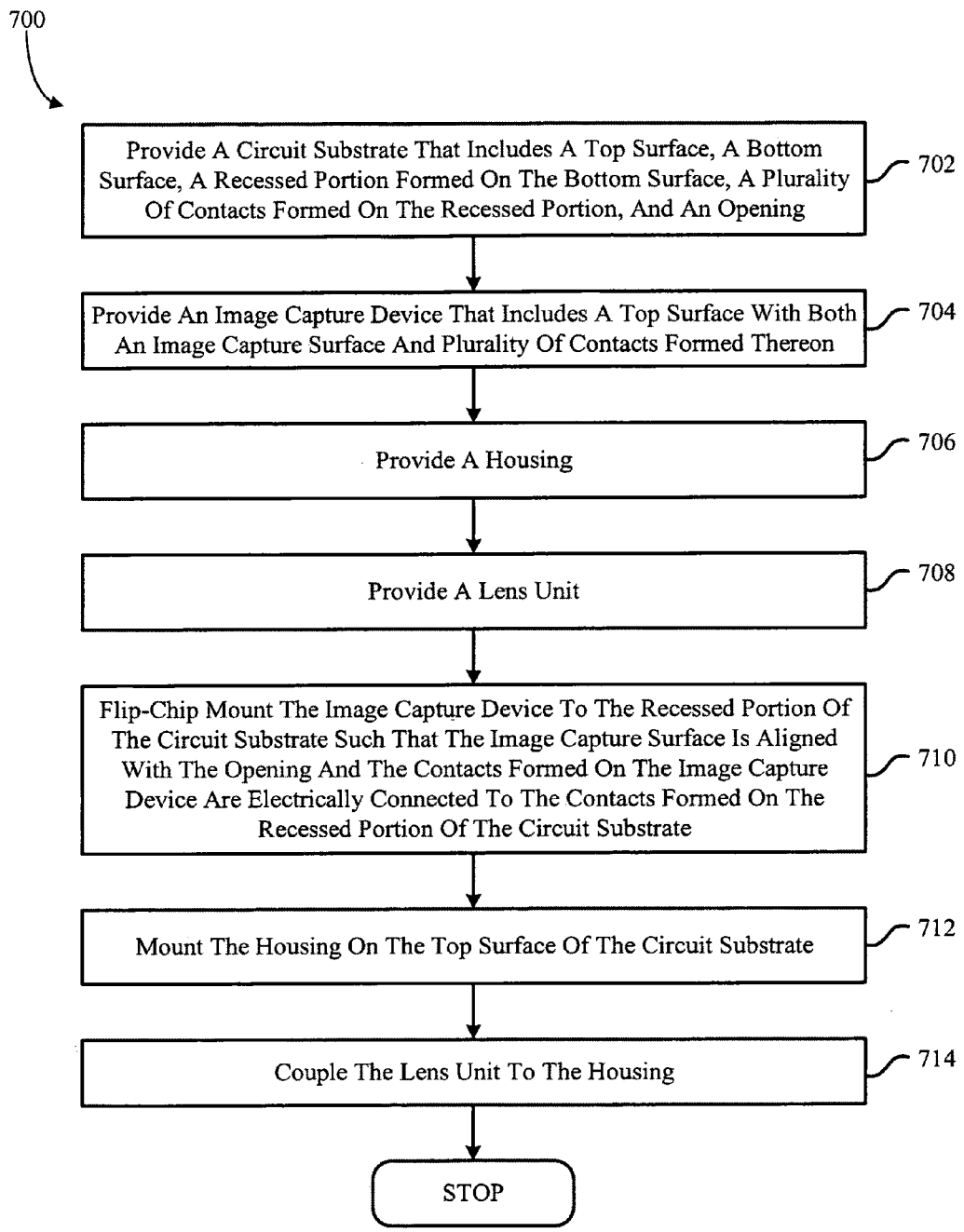
FIG. 7 is a flow chart summarizing one example method of manufacturing the camera module of FIG. 1.

FIG. 7 is a flow chart summarizing an example method 700 of manufacturing camera modules according to the present invention. In a first step 702, a circuit substrate that includes a top surface, a bottom surface, a recessed portion formed on the bottom surface, a plurality of electrical contacts formed on the recessed portion, and an opening is provided. Then, in a second step 704, an image capture device that includes a top surface with both an image capture surface and a plurality of electrical contacts formed thereon is provided. Next, in a third step 706, a housing is provided. Then, in a fourth step 708, a lens unit is provided. Next, in a fifth step 710, the image capture device is flip-chip mounted to the recessed portion of the circuit substrate such that the image capture surface is aligned with the opening and the electrical contacts formed on the image capture device are electrically connected to the contacts formed on the recessed portion of the circuit substrate. Then, in a sixth step 712, the housing is mounted on the top surface of the circuit substrate. Finally, in a seventh step 714, the lens unit is coupled to the housing.

The description of particular embodiments of the present invention is now complete. Many of the described features may be substituted, altered or omitted without departing from the scope of the invention. For example, alternate camera module housings (e.g., auto-focus voice coil housing), may be substituted for the disclosed fixed factory focus housing. As another example, alternate flip-chip bonding techniques (e.g., thermosonic bonding), may substitute the thermocompression bonding approach. As another example, alternate electrical contact bonding elements (e.g., sputter plated bumps, conductive paste, anisotropic conductive paste/film etc.), may be substituted for the gold stud bumps. These and other deviations from the particular embodiments shown will be apparent to those skilled in the art, particularly in view of the foregoing disclosure.

We claim:

1. A camera module comprising:
a flexible circuit substrate including a first surface, an opposite second surface, and an opening, said first surface of said flexible circuit substrate including a first set of electrical contacts;
an image capture device having a top surface and an opposite bottom surface, said top surface of said image capture device including an image capture surface and a first set of electrical contacts, said top surface of said image capture device being coupled to said first surface of said flexible circuit substrate, said first set of electrical contacts of said image capture device being electrically connected to said first set of electrical contacts of said flexible circuit substrate, said image capture surface being aligned with said opening of said flexible circuit substrate;
a housing mounted over said second surface of said flexible circuit substrate;
a first stiffener, said first stiffener being formed on said second surface of said flexible circuit substrate to sandwich the flexible circuit substrate between the image capture device and the first stiffener; and
a lens unit coupled to said housing, said lens unit being aligned with said opening of said flexible circuit substrate and said image capture surface of said image capture device.

2. A camera module according to claim 1, wherein said second surface of said flexible circuit substrate includes a first set of electrical contacts;
said camera module further includes
at least one electrical component; and
said at least one electrical component is mounted on said second surface of said flexible circuit substrate and electrically connected to said first set of electrical contacts of said second surface of said flexible circuit substrate.

3. A camera module according to claim 2, wherein said first stiffener is formed over said at least one electrical component.

4. A camera module according to claim 3, wherein said first stiffener is composed of a moldable material, said first stiffener being formed by molding said moldable material directly over said at least one electrical device and directly on said second surface of said flexible circuit substrate.

5. A camera module according to claim 4, wherein said first stiffener is formed via transfer molding and said at least one electrical device is permanently embedded within said first stiffener.

6. A camera module according to claim 3, wherein:
said first surface of said flexible circuit substrate includes a recessed portion;
said first set of electrical contacts of said first surface of said flexible circuit substrate are formed on said recessed portion; and
said image capture device is flip-chip mounted to said recessed portion.

7. A camera module according to claim 6, wherein said recessed portion defines a recess adapted to receive said image capture device, the depth of said recess being greater than the thickness of said image capture device.

8. A camera module according to claim 1, wherein said at least one electrical component is reflow soldered to said first set of electrical contacts of said second surface of said flexible circuit substrate.

9. A camera module according to claim 1, wherein said first stiffener defines an opening, said opening of said first stiffener being aligned with said opening of said flexible circuit substrate.

10. A camera module according to claim 9, further comprising an infrared filter, said infrared filter being positioned in said opening defined by said first stiffener and over said opening of said flexible circuit substrate, said infrared filter being mounted on said second surface of said flexible circuit substrate.

11. A camera module comprising:
a flexible circuit substrate including a first surface, an opposite second surface, and an opening, said first surface of said flexible circuit substrate including a first set of electrical contacts;
an image capture device having a top surface and an opposite bottom surface, said top surface of said image capture device including an image capture surface and a first set of electrical contacts, said top surface of said image capture device being coupled to said first surface of said flexible circuit substrate, said first set of electrical contacts of said image capture device being electrically connected to said first set of electrical contacts of said flexible circuit substrate, said image capture surface being aligned with said opening of said flexible circuit substrate;
a housing mounted over said second surface of said flexible circuit substrate; and
a lens unit coupled to said housing, said lens unit being aligned with said opening of said flexible circuit substrate and said image capture surface of said image capture device; wherein:
said first surface of said flexible circuit substrate includes a recessed portion;
said first set of electrical contacts of said first surface of said flexible circuit substrate are formed on said recessed portion;
and said image capture device is flip-chip mounted to said recessed portion.

12. A camera module according to claim 11, wherein said recessed portion defines a recess adapted to receive said image capture device, the depth of said recess being greater than the thickness of said image capture device.

13. A camera module according to claim 12, wherein said first surface of said flexible circuit substrate further includes a second set of electrical contacts.

14. A camera module according to claim 1, wherein said lens unit is permanently mounted in a fixed position with respect to said image capture device.

15. A camera module according to claim 1, wherein said first set of electrical contacts of said top surface of said image capture device are electrically connected to said first set of electrical contacts of said first surface of said flexible circuit substrate via conductive bumps.

16. A camera module according to claim 1, wherein at least one of said first set of electrical contacts of said top surface of said image capture device is electrically connected to said a respective one of said first set of electrical contacts of said first surface of said flexible circuit substrate via a single conductive bump.

17. A camera module according to claim 15, wherein said conductive bumps are stud bumps.

18. A camera module according to claim 17, wherein said stud bumps are gold stud bumps.

19. A camera module according to claim 15, wherein said conductive bumps are sputter plated bumps.

20. A camera module according to claim 15, further comprising non-conductive paste disposed between said top surface of said image capture device and said first surface of said flexible circuit substrate.

21. A camera module according to claim 15, further comprising anisotropic conductive film disposed between said top surface of said image capture device and said first surface of said flexible circuit substrate.

22. A camera module according to claim 21, further comprising anisotropic conductive paste disposed between said top surface of said image capture device and said first surface of said flexible circuit substrate.

23. A method for manufacturing a camera module, said method comprising:
providing a flexible circuit substrate including a first surface, a second surface, and an opening, said bottom surface of said flexible circuit substrate including a first set of electrical contacts;
providing an image capture device having a top surface and an opposite bottom surface, said top surface of said image capture device including an image capture surface and a first set of electrical contacts;
providing a housing;
providing a lens unit;
mounting said image capture device on said flexible circuit substrate such that said top surface of said image capture device faces said first surface of said flexible circuit substrate and said first set of electrical contacts of said top surface of said image capture device is electrically connected to said first set of electrical contacts of said first surface of said flexible circuit substrate;
mounting said housing over said second surface of said flexible circuit substrate such said housing is aligned with said opening of said flexible circuit substrate;
coupling said lens unit with said housing such that said lens unit is aligned with said opening of said flexible circuit substrate;
providing at least one electrical device;
mounting said at least one electrical device on said second surface of said flexible circuit substrate to sandwich the flexible circuit substrate between the image capture device and the at least one electrical device; and
electrically connecting said at least one electrical device to said flexible circuit substrate.

24. The method of claim 23, further comprising forming a first stiffener over said at least one electrical component on said second surface of said flexible circuit substrate.

25. The method of claim 24, wherein said step of forming said first stiffener includes providing a moldable material and molding said moldable material directly over said at least one electrical device and directly on said second surface of said flexible circuit substrate.

26. The method of claim 25, wherein said step of molding said moldable material includes transfer molding said moldable material.

27. The method of claim 24, wherein:
said first surface of said flexible circuit substrate includes a recessed portion;
said first set of electrical contacts of said first surface of said flexible circuit substrate are formed on said recessed portion; and
said step of mounting said image capture device to said flexible circuit substrate includes flip-chip mounting said image capture device to said recessed portion.

28. The method of claim 27, wherein said recessed portion defines a recess adapted to receive said image capture device, the depth of said recess being greater than the thickness of said image capture device.

29. The method of claim 23, wherein:
said at least one electrical component includes a set of electrical contacts;
said second surface of said flexible circuit substrate includes a set of electrical contacts; and
said step of electrically connecting said at least one electrical device to said flexible circuit substrate includes reflow soldering said electrical contacts of said at least one electrical device to electrical contacts of said second surface of said flexible circuit substrate.

30. The method of claim 23, further comprising forming a first stiffener on said second surface of said flexible circuit substrate.

31. The method of claim 30, wherein said step of forming said first stiffener includes providing a moldable material and molding said moldable material directly on said second surface of said flexible circuit substrate.

32. The method of claim 31, wherein said step of molding said moldable material includes transfer molding said moldable material.

33. The method of claim 30, wherein said first stiffener defines an opening, said opening of said first stiffener being aligned with said opening of said flexible circuit substrate.

34. The method of claim 33, further comprising:
providing an infrared filter;
positioning said infrared filter in said opening defined by said first stiffener; and
mounting said infrared filter on said second surface of said flexible circuit substrate.

35. The method of claim 34, wherein said first stiffener defines a recess adapted to receive said infrared filter and said step of mounting said infrared filter on said stiffener includes seating said infrared filter in said recess.

36. The method of claim 23, wherein:
said first surface of said flexible circuit substrate includes a recessed portion;
said first set of electrical contacts of said first surface of said flexible circuit substrate are formed on said recessed portion; and
said step of mounting said image capture device to said flexible circuit substrate includes flip-chip mounting said image capture device to said recessed portion.

37. The method of claim 36, wherein said recessed portion defines a recess adapted to receive said image capture device, the depth of said recess being greater than the thickness of said image capture device.

38. The method of claim 36, wherein said first surface of said flexible circuit substrate further includes a second set of electrical contacts.

39. The method of claim 23, wherein said step of coupling said lens unit with said housing includes permanently mounting said lens unit in a fixed position with respect to said image capture device.

40. The method of claim 23, wherein said step of mounting said image capture device on said flexible circuit substrate includes forming a conductive bump on each of said electrical contacts of said top surface of said image capture device and electrically bonding each bump to a respective one of said first set of electrical contacts of said first surface of said flexible circuit substrate.

41. The method of claim 40, wherein said step of electrically bonding each bump includes simultaneously bonding each bump via gang bonding.

42. The method of claim 40, wherein said conductive bumps are stud bumps.

43. The method of claim 42, wherein said stud bumps are gold stud bumps.

44. The method of claim 40, wherein said conductive bumps are sputter plated bumps.

45. The method of claim 40, wherein said step of mounting said image capture device to said flexible circuit substrate includes providing non-conductive paste and disposing said non-conductive paste between said top surface of said image capture device and said first surface of said flexible circuit substrate.

46. The method of claim 40, wherein said step of mounting said image capture device to said flexible circuit substrate includes providing anisotropic conductive film and disposing said anisotropic conductive film between said top surface of said image capture device and said first surface of said flexible circuit substrate.

47. The method of claim 40, wherein said step of mounting said image capture device to said flexible circuit substrate includes providing anisotropic conductive paste and disposing said anisotropic conductive paste between said top surface of said image capture device and said first surface of said flexible circuit substrate.

48. The method of claim 23, said method comprising:
providing a second flexible circuit substrate including a first surface, a second surface, and an opening, said first surface of said second flexible circuit substrate including a first set of electrical contacts;
providing a second image capture device having a top surface and an opposite bottom surface, said top surface of said second image capture device including an image capture surface and a first set of electrical contacts;
providing a second housing;
providing a second lens unit;
mounting said second image capture device on said second flexible circuit substrate such that said top surface of said second image capture device faces said first surface of said second flexible circuit substrate and said first set of electrical contacts of said top surface of said second image capture device is electrically connected to said first set of electrical contacts of said first surface of said second flexible circuit substrate;
mounting said second housing over said second surface of said second flexible circuit substrate such said second housing is aligned with said opening of said second flexible circuit substrate; and
coupling said second lens unit with said second housing such that said second lens unit is aligned with said opening of said second flexible circuit substrate.

49. The method of claim 48, wherein said step of providing said first flexible circuit substrate and said step of providing said second flexible circuit substrate includes providing a single circuit substrate having a plurality of discrete circuit regions, said first flexible circuit substrate being a first discrete circuit region of said single circuit substrate and said second flexible circuit substrate being a second discrete circuit region of said single circuit substrate.

50. The method of claim 49, wherein said single circuit substrate is flexible circuit tape.

51. The method of claim 49, wherein:
said step of mounting said first image capture device on said first flexible circuit substrate includes mounting said first image capture device on a bottom surface of said first discrete circuit region of said single circuit substrate;
said step of mounting said second image capture device on said second flexible circuit substrate includes mounting said second image capture device on a bottom surface of said second discrete circuit region of said single circuit substrate;
said step of mounting said first housing on said first flexible circuit substrate includes mounting said first housing on a top surface of said first discrete circuit region of said single circuit substrate; and
said step of mounting said second housing on said second flexible circuit substrate includes mounting said second housing on a top surface of said second discrete circuit region of said single circuit substrate.

52. The method of claim 51, wherein said first housing is mounted on said first discrete circuit region after said first image capture device is mounted on said first discrete circuit region and said second housing is mounted on said second discrete circuit region after said second image capture device is mounted on said second discrete circuit region.

53. The method of claim 51, further comprising:
providing a first set of electrical components;
providing a second set of electrical components;
mounting said first set of electrical components on said top surface of said first discrete circuit region; and
mounting said second set of electrical components on said top surface of said second discrete circuit region.

54. The method of claim 53, wherein said first image capture device is mounted on said first discrete circuit region after said first set of electrical components is mounted on said first discrete circuit region and said second image capture device is mounted on said second discrete circuit region after said second set of electrical components is mounted on said second discrete circuit region.

55. The method of claim 53, further comprising forming a first stiffener over said first set of electrical components and forming a second stiffener over said second set of electrical components, said first stiffener being formed after said first set of electrical components are mounted on said first discrete circuit region and before said first image capture device is mounted on said first discrete circuit region, said second stiffener being formed after said second set of electrical components are mounted on said second discrete circuit region and before said second image capture device is mounted on said second discrete circuit region.

56. The method of claim 55, further comprising separating said first discrete circuit region from said single circuit substrate after said first housing is mounted on said first discrete circuit region and separating said second discrete circuit region from said single circuit substrate after said second housing is mounted on said second discrete circuit region.

57. The method of claim 56, wherein said first discrete circuit region and said second discrete circuit region are separated from said single circuit substrate via punching.

* * * * *